(12) United States Patent
Dixit et al.

(10) Patent No.: US 6,589,865 B2
(45) Date of Patent: Jul. 8, 2003

(54) LOW PRESSURE, LOW TEMPERATURE, SEMICONDUCTOR GAP FILLING PROCESS

(75) Inventors: Girish A. Dixit, Plano, TX (US); Anthony Konecni, Plano, TX (US); Robert H. Havemann, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/899,194

(22) Filed: Jul. 6, 2001

(65) Prior Publication Data

US 2002/0064942 A1 May 30, 2002

Related U.S. Application Data

(62) Division of application No. 08/766,199, filed on Dec. 12, 1996, now Pat. No. 6,333,265.
(60) Provisional application No. 60/008,535, filed on Dec. 12, 1995.

(51) Int. Cl.[7] ................................... H01L 21/4763
(52) U.S. Cl. ................ 438/637; 438/474; 438/475; 438/629; 438/639; 438/672; 438/674; 438/675; 438/680
(58) Field of Search ............... 438/637–40, 629, 438/474–75, 672–675, 642–44, 680–81

(56) References Cited

U.S. PATENT DOCUMENTS 4,023,197 A  *  5/1977  Magdo et al. ............ 23/48
4,121,241 A     10/1978  Drake et al.

(List continued on next page.)

FOREIGN PATENT DOCUMENTS

| JP | 63-262473 | 10/1988 |
| JP | 370775 | 5/1990 |
| JP | 2-194179 | 7/1990 |
| JP | 2-205321 | 8/1990 |
| JP | 4-171744 | 6/1992 |
| JP | 4-259218 | 9/1992 |

OTHER PUBLICATIONS

Characterization of Direct–Contact Via Plug FOrmed by Using Slective ALuminum Chemical Vapor Depostion— Takeyasu et al.—Japn J. Appl. Phys. vol. 33 (1994) pp 424–428.
Hydrigen plasma chemical cleaning of metallic substrates and silicon wafers—N. Korner et al.—Surface and Coatings Technology 76–77 (1995).
Via Plugging by Selective–CVD–Al: Pretreatment of Via Holes with or without Cap–Metal—N. Takeyasu et al.— Conference Proceedings ULSI–X—1995 Research Materials Research Society.
K. Mizobuchi et al., "Application of Force Fill Al–plug technology to 64 DRAM and 0.35 micrometer logic", 1995 Symposium on VLSI Technology, Japan Soc. Appl. Phys. pp. 45–6.

*Primary Examiner*—Matthew Smith
*Assistant Examiner*—Granvill D Lee, Jr.
(74) *Attorney, Agent, or Firm*—Wade James Brady, III; Frederick J. Telecky, Jr.

(57) ABSTRACT

A structure and process is provided for filling integrated circuit cavities such as contacts and vias. These structures are filled at relatively low temperatures of no more than about 300° C., and preferably between about 20°–275° C., which temperature range permits for the use of low dielectric constant ($\kappa$) polymers (i.e., $\kappa < {\sim}3.0$). Preferably, the cavities are provided with an elemental titanium-free liner to facilitate cavity filling, and the cavities are filled with CVD aluminum that is introduced into the cavities by way of a forcefill at pressures ranging from atmospheric to about 50 MPa, and preferably no more than about 30 MPa, at temperatures ranging from about 100°–300° C. Cavities filled in the foregoing manner exhibit electrical resistance levels that are up to 30% less than structures filled by conventional practices.

12 Claims, 3 Drawing Sheets

U.S. PATENT DOCUMENTS

| | | | | |
|---|---|---|---|---|
| 4,517,225 A | * | 5/1985 | Broadbent | 427/89 |
| 5,036,373 A | * | 7/1991 | Yamazaki | 357/117 |
| 5,043,299 A | | 8/1991 | Chang et al. | |
| 5,180,687 A | * | 1/1993 | Mikoshiba et al. | 437/187 |
| 5,193,017 A | | 3/1993 | Iwai et al. | |
| 5,244,535 A | | 9/1993 | Ohtsuka et al. | 156/643 |
| 5,252,181 A | | 10/1993 | Dutarte et al. | |
| 5,312,518 A | * | 5/1994 | Kadomura | 156/662 |
| 5,338,398 A | * | 8/1994 | Szwejkowski et al. | 156/655 |
| 5,350,480 A | * | 9/1994 | Gray | 156/345 |
| 5,470,802 A | * | 11/1995 | Gnade et al. | 437/238 |
| 5,487,923 A | * | 1/1996 | Min et al. | 427/569 |
| 5,572,071 A | | 11/1996 | Lee | 257/751 |
| 5,612,254 A | | 3/1997 | Mu et al. | 437/195 |
| 5,620,925 A | | 4/1997 | Nakata et al. | |
| 5,712,207 A | | 1/1998 | Lee et al. | 438/627 |
| 5,789,819 A | * | 8/1998 | Gnade et al. | 257/759 |
| 5,843,843 A | * | 12/1998 | Lee et al. | 438/688 |
| 6,008,139 A | | 12/1999 | Pan et al. | |
| 6,020,254 A | | 2/2000 | Taguwa | |
| 6,051,492 A | | 4/2000 | Park et al. | |
| 6,143,129 A | | 11/2000 | Savas et al. | |
| 6,150,252 A | * | 11/2000 | Hsu et al. | 438/597 |
| 6,399,486 B1 | * | 6/2002 | Chen et al. | 438/660 |

* cited by examiner

LOW PRESSURE, LOW TEMPERATURE, SEMICONDUCTOR GAP FILLING PROCESS

This application is a division of Ser. No. 08/766,199, filed Dec. 12, 1996 now U.S. Pat. No. 6,333,265 which claims priority under 35 U.S.C. 119(e) based upon provisional application Ser. No. 60/008,535, filed Dec. 12, 1995.

TECHNICAL FIELD OF THE INVENTION

This invention relates to semiconductor manufacturing processes, and more particularly to processes for gap filling between adjacent surfaces or levels of a semiconductor.

BACKGROUND OF THE INVENTION

Many obstacles exist to further miniaturization of semiconductor components. Among these obstacles include the filling of metal interconnect layers to insure proper operation of the devices. Metal interconnect signal lines make contact to lower conductive layers of the integrated circuit through vias that are formed in an insulating layer. It is desirable to completely fill the via with the metal that is used to form the interconnect layer so as to insure optimal operation of the device.

For reasons of its cost, physical properties and availability, aluminum is presently the metal of choice for the fabrication of metal interconnect lines in integrated circuits. The interconnect lines are typically formed by a sputtering process which can result in less than optimal filling of the contact vias. Problems arise from the accumulation of relatively large grains of aluminum at the upper surface of the insulating layer. The accumulation of such grains at the edges of the contact via can block or otherwise obstruct the via prior to passage of the aluminum in sufficient quantity to completely fill the via, resulting in the formation of voids and uneven structures within the via. This problem is particularly acute as integrated circuits are fabricated using smaller geometries. The smaller contacts that are used in smaller geometry devices, such as the current 0.5 $\mu$m and future generations of scaled technologies, necessarily have a larger aspect ratio (i.e., relationship of feature height to width) than do larger geometry devices, thereby exacerbating the via filling difficulties described above. For example, unduly large voids can result in contact resistance that is appreciably higher than designed. In addition, thinner regions of the aluminum layer adjacent to the via fill region will be subject to eletromigration, which can result in the eventual opening of the circuits and failure of the device.

A number of different approaches have been attempted to ensure optimal metal contact at lower interconnect levels. For example, refractory to metal layers have been used in conjunction with an aluminum interconnect layer to improve conduction throughout a via. In addition, via side walls have been sloped so as to improve metal step coverage into vias. The use of sloped side walls, however, has become less desirable as the industry adopts smaller device geometries. Even with the geometries above 0.5 $\mu$m, the foregoing techniques have not completely overcome the difficulties in the via filling. It is believed that the problem of via filling in the past has been at least partially attributable to the relatively low temperatures at which the aluminum was processed incident to via filling. These temperatures typically are below 500° C. which some manufacturers believe contributes to the formation of aluminum grain sizes that are unduly large for via filling.

U.S. Pat. No. 5,108,951 to Chen, et al., which issued on Apr. 28, 1992 attempts to address the foregoing problem of via filling arising from the flow of aluminum grains of unduly large size. In this patent, the temperature of the integrated circuit is heated to a temperature of about 400° C. prior to the commencement of aluminum deposition. Aluminum is deposited into the via during the course of wafer heating to a temperature of about 500° C. Aluminum is deposited into the via at a rate of about 30–80 Å/sec during the course of wafer heating. This prior art system shares many of the same disadvantages of the previously addressed prior art, namely incomplete via filling, particularly at smaller via geometries. In addition, via filling is undertaken at temperatures in the vicinity of about 500° C., which prevents the use of polymeric materials as dielectrics in the integrated circuit, as these polymeric materials typically decompose at such high temperatures.

In view of the foregoing deficiencies in the prior art, it is desirable to provide an integrated circuit filling process for contacts and vias which provides for a reliable filling at relatively low temperatures, preferably on the order of about 250–450° C. Contact and via filling at such low temperatures will permit for the use of more optimal dielectric materials which is critical to the development of sub-0.5 $\mu$m technologies.

SUMMARY OF THE INVENTION

As a consequence of the foregoing prior art deficiencies, it is desirable to provide a process for the filling of integrated circuit contacts and vias which is operable at relatively low temperatures of no more than about 300° C., and preferably between about 20°–275° C., which temperature range will permit for the use of low dielectric constant ($\kappa$) polymers (i.e., $\kappa$<~3.0), the use of which has heretofore not been possible due to the high temperatures required in prior art via filling processes.

The invention provides a filled cavity structure, such as a contact or via, and process of cavity structure fill that can provides for a cavity fill at heretofore unprecedented low temperatures. The structure and process of the invention permit cavity filling with aluminum, aluminum alloys, copper, and copper alloys. Contacts and vias to be filled with such metals can optionally be lined with physical vapor deposition ("PVD") or chemical vapor deposition ("CVD") refractory metals and/or metal alloys prior to deposition of the cavity fill material to enhance deposition of the fill metal within the cavity. The cavities to be filled can be formed through various dielectrics or combinations of dielectrics which exhibit advantageously low dielectric constants ($\kappa$) of less than about 3.0, and preferably between 1.5–2.5 or lower.

In accordance with the present invention, an improved filling process is provided which allows for enhanced filling of contacts, vias and trenches formed in dielectrics of integrated circuits, particularly sub-0.5 $\mu$m technologies. In a preferred aspect of the invention, cavity filling proceeds in a multi-step process by first depositing a CVD or PVD liner or barrier layer, preferably at a temperature range of about 100°–300° C. at sub-atmospheric processing pressures of about 0.1–50 Torr (1 atmosphere=760 Torr). Preferably, the liner is an elemental Ti-free liner of the type disclosed in U.S. Pat. No. 5,849,367 of G. Dixit, et al.

Once the liner/barrier layer has been deposited, elemental or pure aluminum can be CVD deposited at a temperature of ~100°–300° C. and processing pressure of about 0.1–50 Torr in a suitable cavity fill precursor atmosphere, such as dimethyl aluminum hydride ("DMAH") or tri-isobutyl aluminum ("TIDA"), to a thickness of ~500–5,000 Å, followed (optionally) by an PVD aluminum alloy overlayer of Al—Cu(~0–2%), Al—Si(~1%)—Cu(~0.5–2%), Al—Ta (~0.01–0.5%), or Al—Ti(~0.01–0.5%). The composite aluminum/aluminum alloy stack is exposed to a pressure of about 1 atm.–~30 MPa at a temperature in the range of about 20°–300° C. to completely fill the cavity by "force fill". Such processing is in sharp contrast to that of the prior art, which typically provides for processing at pressures in excess of 100–300 MPa and at temperatures typically in excess of 300° C., and typically in excess of 450°–500° C., which temperatures far exceed the decomposition temperature of polymeric dielectrics having dielectric constants below 3.0. The process of the present invention is applicable for a variety of metals and metal alloys, adjustments to the processing parameters disclosed above being undertaken in accordance with the various physical and chemical properties of the material to be filled into the respective cavities, gaps, holes or trenches.

Suitable metals and metal alloys for use in the present invention include, by way of non-limiting example, the following materials: (1) Al—Ti (0.1%)—Cu(0.5%); (2) Al—Cu (0.5%); (3) Al—Cu (1%); (4) Al—Si (1%)—Cu (0.5%); and (5) aluminum. In addition, the process of the present invention is suitable for use with refractory metals and metal alloys, such as. (1) copper (Cu): (2) alloys of copper with one or more of magnesium (Mg), gold (Au) and silver (Ag); and Al—Sc—Cu. The process of the invention is also applicable for use in the application of various refractory claddings and bassiers, such as those formed from titanium (Ti), TiN, combinations of Ti and TiN, TiW, and tungsten (W).

The processing regimen of the present invention is particularly advantageous when processing integrated circuits with polymeric insulators since such insulators typically decompose at temperatures of about 350° C. or greater. Such polymeric insulators include, by way of non-limiting example, the family of polytetrafluoroethylene ("PTFE") compounds, which exhibit a dielectric constant of 1.9 and are therefore very attractive because of their ability to reduce parasitic capacitance of interconnects, parylene, aerogels and xerogels.

The processing techniques of the present invention are also applicable to ensure complete filling of holes and/or trenches that are formed through various dielectic materials or combinations of dialectic materials. As such the process techniques of the present invention are applicable for the family of damascene and dual damascene processing techniques, in which a groove is etched or otherwise formed in an oxide or other dielectric, then filled with a metal (usually tunsten or copper) in an appropriate deposition process such as chemical vapor deposition ("CVD"), after which the applied metal is polished so as to be flush to the surface of the dielectric. In the dual damascene process, not only is a groove etched or otherwise formed in the dielectric, but in addition thereto a via is patterned and etched so as to extend from an upper level of metal through a dielectric to a lower level of metal. Suitable dielectrics for use in the present invention include the family of polymeric spin-on-glass ("SOG") materials, such as the 1500 Series manufactured by Allied Signal Corp.; the family of PTFE; parylene; polyimides; hydrogen silsesquioxane; aerogels and surface modified aerogels such as fluorinated and methylated aerogels, all of which are more fully described an incorporated herein by reference in one or more of the following copending patent applications: (1) Ser. No. 08/234,100 filed Apr. 28, 1994 and entitled "Self-Aligned Via Using Low Permittivity Dielectric"; (2) Ser. No. 08/286,761 filed Aug. 5, 1994 entitled "Porous Dielectric Layer With a Passivation Layer for Electronics Applications"; (3) Ser. No. 08/294,290 filed Aug. 23, 1994 entitled "Self-Aligned Contact Using Organic Dielectric Materials"; (4) Ser. No. 08/246,432 filed May 20, 1994 entitled "Interconnect Structure with an Integrated Low Density Dielectric"; and (5) Ser. No. 08/333,015 filed Nov. 1, 1994 entitled "Pillars For Improved Damascene Conductor Fabrication".

BRIEF DESCRIPTION OF THE DRAWINGS

These and other features of the invention will be apparent to those skilled in the art from a reading of the following detailed description of the invention, taken together with the accompanying drawings, in which.

The novel features and objects of the present invention will be apparent from a reading of the accompanying specification when read in conjunction with the accompanying drawings, in which.

DETAILED DESCRIPTION OF THE PREFERRED EMBODIMENTS

Figure 1A:
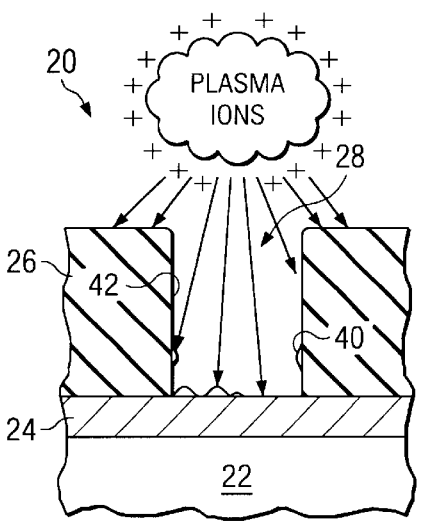
FIGS. 1A and 1B are cross-sectional illustrations of a via at initial and subsequent stages, respectively, of processing in accordance with the present invention.

It is to be understood and appreciated that the process steps and structures described below do not form a complete process flow for the manufacture of integrated circuits. The present invention can be practiced in conjunction with integrated circuit fabrication techniques that are currently used in the art, and only so much of the commonly practiced process steps are included herein as are necessary to provide an understanding of the present invention. The drawing figures that are included with this specification and which represent cross-sections of portions of an integrated circuit during fabrication are not drawn to scale, but instead are drawn so as to illustrate the relevant features of the invention.

Aluminum reflow for contact/via filling in 0.5 $\mu$m applications has been previously demonstrated. However, aluminum reflow processes have not been widely accepted due to the higher deposition temperatures required and the difficulty in globally filling the high aspect ratio contacts and vias of ULSI circuits. Global filling is of particular concern for sub-0.5 $\mu$m applications, since a viable aluminum reflow technology must be capable of achieving equivalent or better yield and reliability as compared to conventional tungsten plug technology. The processes of the present invention demonstrate that enhanced aluminum fill at temperatures less than 450° C. is indeed a viable process for sub-0.5 $\mu$m applications.

The advantages of an aluminum fill technology compared with integrated W-plug/aluminum leads include lower resistance contacts/vias. fewer overall process steps and improved electromigration performance. One of the principal disadvantages of conventional aluminum reflow processes has been their sensitivity of reflow to surface conditions and hole profile. Conventional hot sputter deposition and/or reflow processes rely on the diffusive mobility of the adatoms. Higher contact/via aspect ratios and the typical protrusion of sputtered barrier layers at the hole entrance adversely affect reflow characteristics. As a consequence, global filling has been difficult to achieve on a regular, reproducible basis.

The present invention provides, among other things, a global aluminum aperture or gap fill technology that is capable of achieving complete filling of high aspect ratio sub-0.5 μm apertures or gaps at temperatures less than 400° C. The aluminum aperture or gap filling process is complemented by a high throughput T/TiN barrier metal deposition technique that does not use a physical collimator. Yield data from large-scale via chains can be used as a metric to compare the traditional integrated W-plug/aluminum leads, conventional aluminum reflow and the enhanced aluminum fill process. Identical Al—Cu alloys were used for each case. Electromigration reliability data for metal leads and vias is also presented comparing the new process with conventional methods.

With reference to the drawings, wherein like referenced characters represent corresponding parts throughout the various views, and with particular reference to FIG. 1A, there is illustrated a portion of a semiconductor device, designated generally by referenced character 20, that is in the process of assembly in accordance with the teachings of the present invention. The illustrated device 20 at this stage of assembly is comprised of a substrate 22 that is typically formed of a semiconductive material such as silicon. Overlying the substrate 92 is a metal interconnect layer 24 that is typically formed of aluminum. As will be understood by persons of ordinary skill in the art, the metal interconnect layer 24 provides for electrical connection between different levels of an assembled device. A suitable dielectric material 26 is applied in overlying relation with the metal interconnect layer 24 and is patterned and etched in a manner well known in the art to define a cavity 28 such as a contact or via that provides for the electrical connection between metal interconnect layers 24 at different levels of the device. While FIG. 1A illustrates a single via 28 extending to a single metal interconnect layer 24, it is to be appreciated and understood that the invention described herein is likewise applicable to the formation of cavities/vias 28 which extend between different and/or multiple levels of the device so as to provide for electrical interconnection between selected levels of a device under assembly.

Figure 2:
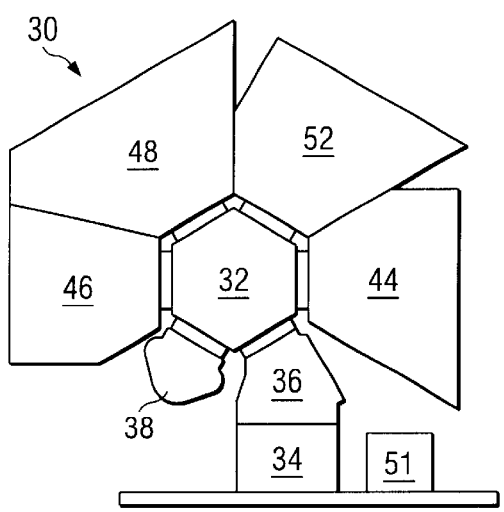
FIG. 2 is a schematic illustration of a cluster tool for use in the practice of the present invention.

Semiconductor devices 20 of the type illustrated in FIG. 1A, can be processed in multi-station processing devices known as "clusters tools", such as those manufactured by Applied Materials, Inc. of San Jose, Calif. and Electrotech Ltd. of Bristol, U.K. A cluster tool, such as that designated by referenced character 30 in FIG. 2, can be provided to fill metal interconnects such as cavities and vias 28 in accordance with the teachings of the present invention, as well as to fill such interlevel connects in accordance with conventional "prior art" practices. The illustrated cluster tool 30 is provided with a generally hexagonal "hub and spoke configuration, and includes a cassette handler 32, that is operable to convey one or more semiconductor wafer cassettes (not shown) from a cassette loading station 34 to a pressure-variable loading dock 36. The loading dock 36 is operable to cycle between different levels of vacuum, as the cassettes are transported by the handler 32 between different process chambers, as will be described below.

The cassette handler 32 is configured as a rotatable, extensible arm that is operable to transfer wafers from thin cassettes to the process chambers and back to cassettes as the wafers undergo various types of processing within the cluster tool 30. A heating station 38 can be provided as one of the processing stations to implement preliminary thermal processing of the wafers.

In conventional device assembly practices, the metal interconnects/vias are filled in a multi-stage process that provides for an initial sputter etch to remove impurities 40 (FIG. 1A) from the cavity wall 42. Such impurities arise incident to the etch process that is used to form the cavities 28. The sputter etch can be performed at one of the processing stations, such as sputter etch station 44 depicted schematically in the cluster tool 30 of FIG. 2. The sputter etch is undertaken to provide for the physical bombardment with neutral gas ions (typically argon) which physically impinge upon and displace impurities 40 along the wall of the cavity 28. However, the etch process typically leaves various residues, such as $Ti_yO_x$, TiNO, and $Al_2O_3$, along the surface of the newly formed cavity. This residue must be cleansed from the cavity prior to further processing to avoid the formation of "open vias/contacts" that establish non-ohmic (high resistance) contacts.

Following pre-cleaning of the newly formed cavities 28, the wafers are typically transferred by handler 32 to a physical vapor deposition ("PVD") station 46 for the application of elemental titanium. Elemental titanium is extremely reactive, and will react with impurities/residue received within the cavity 28 to form discontinuous layers of oxide and allow for the establishment of conductivity readings therebetween.

Figure 3:
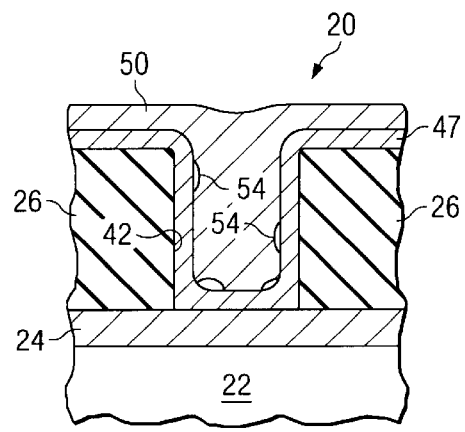
FIG. 3 is a cross-sectional view of a conventional structure at a latter stage of via filling.
Figure 4:
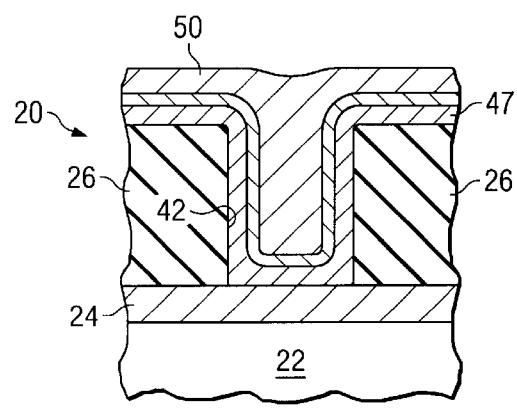
FIG. 4 is a cross-sectional view of a via filled in accordance with the present invention.

Following deposition of the elemental titanium, the handler 32 is operable to transfer the wafers from PVD station 46 (FIG. 2) to either a chemical vapor deposition ("CVD") station or a high temperature (i.e., Temp. >400° C.) sputter deposition station jointly referenced by 48, for application of an appropriate via fill metal or plug 50 (FIG. 3). Operational status of the cluster tool can optionally be displayed on a system monitor 51 that can optionally be connected to a pc or other programmable control device (not shown). Typical fill materials include tungsten, aluminum anchor aluminum alloys, such as Al—Cu(0–2.0%). Recently, various force-fill techniques employing forcefill stations 52 (FIG. 2) have gained favor so as to reduce the incidence of voids 54 (FIG. 3) between the plug material 50 and the liner 47. As will be appreciated, reduction in the number and/or sizes in such voids 54 enhances electrical contact between the metal plug 50 and the liner 47, thereby facilitating electrical conduction through the filled cavity from an overlying metal interconnect layer (not shown) to an underlying metal interconnect layer 24. Following application of the plug 50, the device can be further processed in an appropriate manner, such as processing involving planarization, patterning, etching and the like.

Figure 1B:
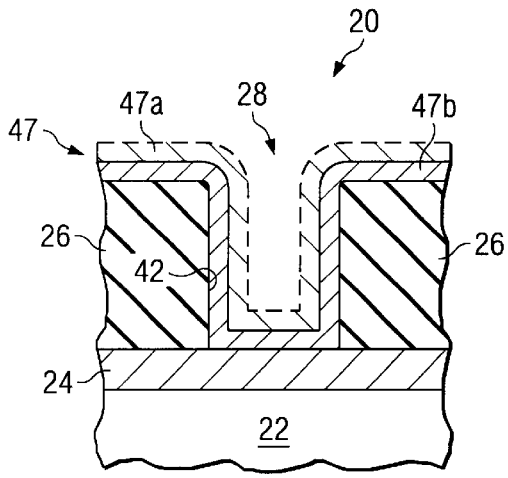

Initial aspects of cavity fill in accordance with the teachings of the present invention are illustrated in FIGS. 1A and 1B. The sputter etch described above is replaced by a low power plasma etch, which can be implemented in a cluster tool 30, to provide for pre-conditioning/cleansing of previously formed cavities, such as vias 28. The process of the present invention is particularly advantageous for use for high aspect ratio cavities, such as cavities having an aspect ratio of about 1.5–5:1, and typically 4–5:1 or greater, whereby the aspect ratio is defined as a ratio between the cavity depth and width. In the operation of the invention, the cluster tool sputter etch station 44 is replaced with a plasma etch station and is operated at low power, typically ≦50–500 watts at a pressure of about 0.1–10 Torr. Optimal processing temperature is in a range of about 100°–450° C. for about 5–60 seconds. The plasma etch station 44 is operable to generate ions of argon, hydrogen, nitrogen and/or ammonia (NH$_3$) and can proceed at a voltage of up to about 400 V to direct the gas ions toward the device 20. Gas flows for each of the foregoing gases can be at a rate of up to about 500 sccm (standard cubic cm). In addition, the device 20 can be biased negative from about −300 to −400 V to attract the ions at high velocity for physical bombardment of the cavity wall 42.

Different gas or combinations of ions ("plasma ions" in FIG. 1A) can be selected in accordance with the nature of the impurities and structural abnormalities included in the cavity/via 28. For example, nitrogen and argon, being heavier ions, would aid in physical bombardment of the substrate surfaces, as the ions would have comparatively greater momentum as opposed to lighter weight hydrogen ions. However, hydrogen can be advantageous due to its ability to chemically reduce thin oxide layers that may be present along metallic surfaces of the cavity/via 28. The use of nitrogen also permits for nitridation of metallic surfaces exposed in the bottom of the cavity/via. Moreover, metallic nitrides, (stoichiometric and non-stoichiometric) are conductive, and would therefore facilitate electrical connection through the filled cavity/via 28.

It is desirable in accordance with the present invention to deposit a refractory metal nitride or carbide liner to facilitate complete filling of the cavity/via 28. Such layers or liners 47 can include, by way of non-limiting example, TiN, TaN, WN, Ti$_x$C$_y$N$_z$ and Ta$_x$C$_y$N$_z$ (y, z=0.25–0.5; x=1−(y+z)), as well as alloys of any of the foregoing materials. The liner layer 47 can be applied by physical vapor or chemical vapor deposition methods in appropriate clustering processing chambers, such as chambers 44 (plasma cleaning), 46 (PVD) and 48 (CVD). The liner that is ultimately provided along the cavity wall 42 is preferably comprised of one or more discrete liner layers 47a, each of which is applied to a thickness of ~25–100 Å. The deposition of each layer is separated by an intervening low power plasma treatment of the type described above. Preferably, the liner is comprised of 2–4 layers 47a (FIG. 1B), depending on such factors as the geometry of the device under manufacture, and the like. Each layer is deposited at a susceptor (i.e., wafer support surface (not shown)) temperature of about 300–480° C. at a pressure of about 0.5–2.0 Torr. Nitrogen flow can be provided at a rate of about 40–200 sccm. TDMAT (He) flow can be provided at a rate of 40–100 sccm. The application of multiple liner layers 47a is indicated by the phantom line in FIG. 1B. As each liner layer 47a can be deposited in a period of about 6 sec., the impact of susceptor temperature on dielectric stability, even at the higher end of the above-referenced temperature range, is minimal.

As has been mentioned previously, high pressure extrusion/forcefill have recently been used in an attempt to complete filling of high aspect ratio contacts and vias. The high pressure process typically requires physical vapor deposition of a contact/via liner, followed by high temperature (i.e., Temp. ≧400° C.) sputter deposition of aluminum/aluminum alloys so as to bridge the top portion of the opening of the contact/via 28. High pressure, of up to 1,000 atm or greater, is applied (FIG. 5) in an effort to extrude the plug material 50 into the cavity 28 to substantially complete filling. It will be appreciated that the success of the foregoing extrusion process is dependent, among other things, upon the efficacy of bridging of the metal at the cavity opening, as cavity filling cannot be accomplished in the absence of bridging of the opening. Bridging is also dependent upon wafer temperature during sputter deposition, with higher temperatures (i.e., Temp. >>400° C.) being more beneficial for bridging, but detrimental to other aspects of the device, such as material integrity, diffusivity and the like. To date, forcefill wafer temperatures of 350°–500° C. (which temperatures are ~30°–50° C. lower than the wafer support (susceptor) temperature) that are commonly employed result in no better than poor-to-moderate bridging. These elevated temperatures are necessary to reduce yield strength and to facilitate plastic flow of the fill metal 50 into the cavity 28; either one of high metal temperature or pressure, in the absence of the other, will not result in optimal cavity fill. Yet, the use of elevated wafer temperatures of the magnitude cited above prohibits the use of many, if not all, low dielectric constant (κ) polymeric dielectric materials (κ<~3.0), as many of these materials decompose and/or melt at wafer temperatures above 350° C. Moreover, operation of equipment at hundreds of atmospheres of pressure poses an undue safety risk to personnel, and requires a level of structural integrity that greatly increases equipment costs. Accordingly, it would be desirable to perform extrusion/forcefill of a cavity plug 50 at temperatures and pressures as close as possible to ambient levels.

Figure 5:
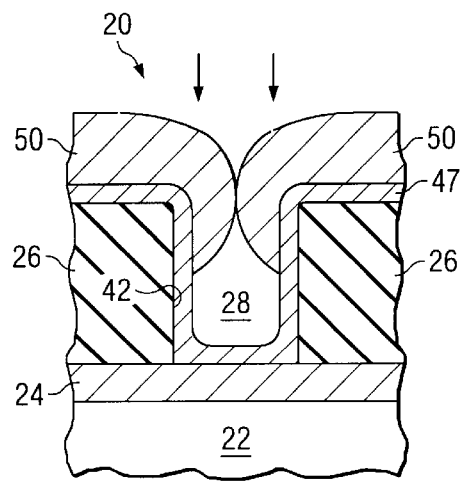
FIG. 5 is a cross-sectional view of a via following bridging incident to filling.
Figure 6:
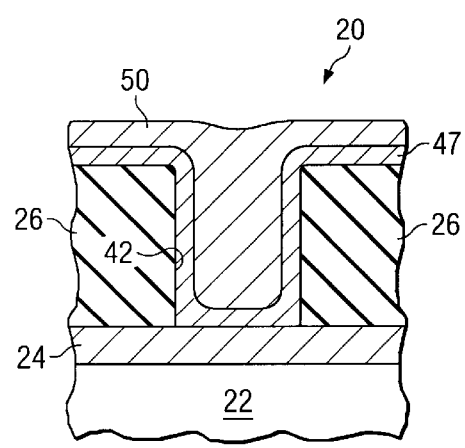
FIG. 6 is a cross-sectional view of via filled in accordance with the present invention.

With reference to FIGS. 5 & 6, details of the extrusion/forcefill process of the invention will be described. At the stage of processing illustrated in FIG. 5, a composite (i.e., multi-layer) liner 47 has been applied in a manner described above to a cavity 28 such as a via or contact that has been formed in a substrate 22. In a preferred aspect of the invention, elemental aluminum is deposited by CVD to a thickness of about 500–5,000 Å at a temperature of about 100°–300° C. and a pressure of about 0.1–50 Torr by way of precursors such as di-methyl aluminum hydride ("DMAH") or tri-isobutyl aluminum ("TIBA") to facilitate the deposition of aluminum atoms into the cavity 28. CVD aluminum typically exhibits relatively large grain size, which can result in micro-voiding within high aspect ratio (≧4–5:1) cavities. A cap layer (not shown) of a PVD aluminum alloy, such as one or more of Al—Cu(~0–2%), Al—Si(1%)—Cu (~0.5–2%), Al—Ta(~0.01–0.5%), and/or Al—Ti (~0.01–0.5%), can optionally be applied to a thickness of about 500–5,000 Å to facilitate doping of the CVD aluminum layer. The composite stack of the CVD aluminum fill metal 50 (and optional overlying PVD alloy) and composite liner 47 are exposed to a pressure in the range of atmospheric –~50 MPa (preferably <30 MPa) at a temperature in the range of about 20°–300° C., and preferably at a temperature of about 260° C., to accomplish extrusion/forcefill of the CVD plug 50 into the cavity 28 and coalesce the cavity micro-voids resulting from the CVD process, as shown in FIG. 6. The resulting structure can be planarized and/or otherwise processed in a conventional manner incident to device assembly.

Figure 7:
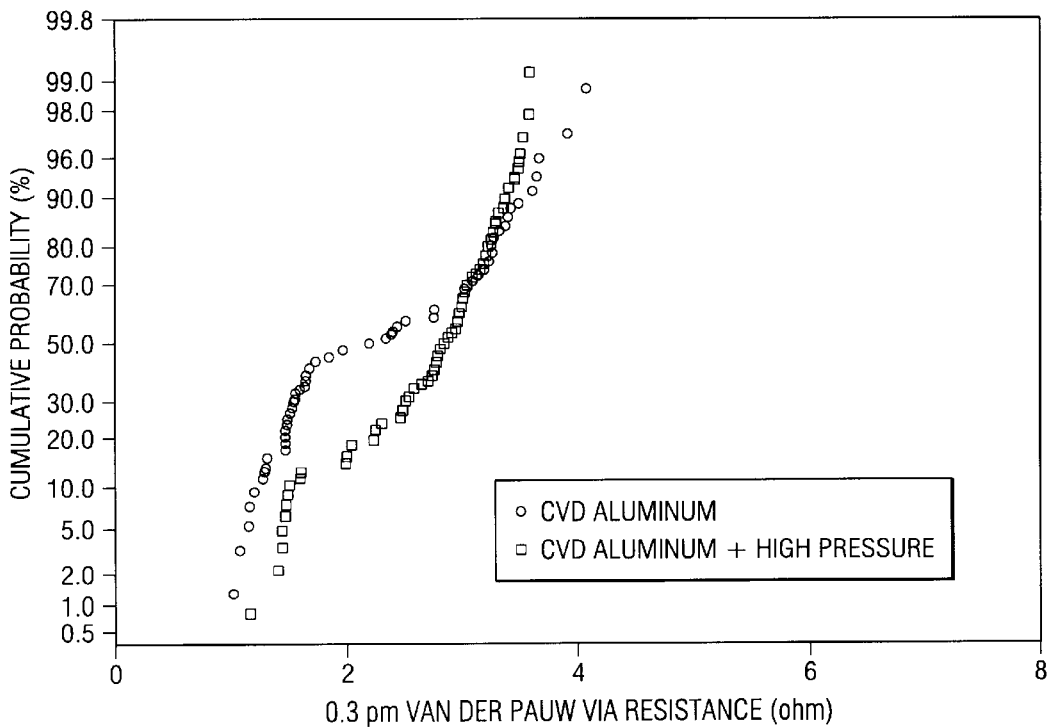
FIGS. 7 and 8 are graphs depicting cumulative probability and via resistance for vias filled in accordance with the present invention and conventional vias, respectively.
Figure 8:
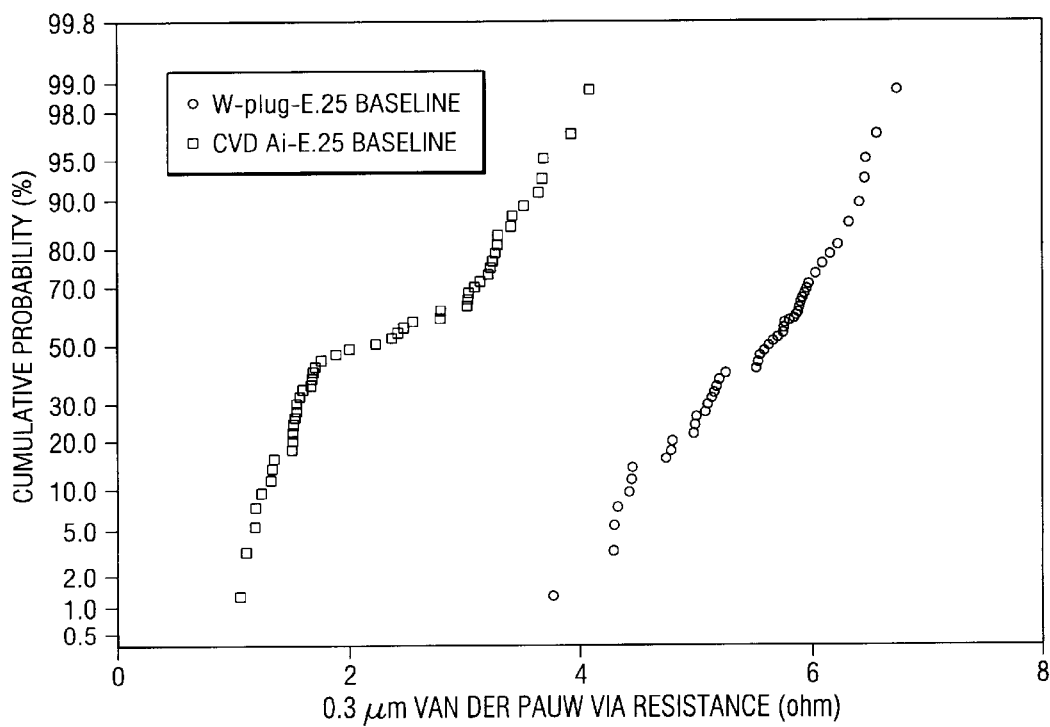

The efficacy of the low temperature, low pressure extrusion/forcefill is illustrated in FIG. 7. As is shown in the drawing, the low temperature, low pressure process of the present invention (denoted "CVD Aluminum") renders a greater cumulative probability (%) of low resistance contacts than does prior art aluminum forcefill (denoted "CVD Aluminum+High Pressure).

The foregoing extrusion/forcefill process is advantageous for, among other reasons, its process parameters (temperature & pressure) are compatible with polymeric dielectrics identified above, and does not present as significant a personnel safety risk as compared to other processes. Moreover, the recited temperature and pressure levels facilitate diffusion into the CVD aluminum of alloying elements, such as Cu, Ta, and Ti, from the optional PVD alloy overlayer. Moreover, compositional uniformity that results from practice of the invention serves to improve electromigration performance, as shown in FIG. 7.

Conclusions

A high-yielding aluminum plug process has been demonstrated for global filling of high aspect ratio (>4:1) contacts and vias as small as 0.25 mm at relatively moderate process temperature (<400C). Compared with conventional W-plug/aluminum leads, the aluminum plug process also exhibits an order of magnitude improvement in reliability. These results establish the viability of enhanced aluminum fill as a sub-0.5 mm manufacturing technology.

Although the present invention and its advantages have been described in connection with the preferred embodiments, it should be understood that various changes, substitutions and alterations can be made herein without departing from the spirit and scope of the invention as defined by the appended claims.

What is claimed is:

1. A process for filling a cavity formed in a semiconductor substrate, comprising the steps of:
    providing a semiconductor substrate having a metal layer thereon and a layer of dielectric material over said metal layer;
    forming a cavity in said layer of dielectric material extending to said metal layer;
    depositing a cavity liner in said cavity at a temperature of from about 100° C. to about 300° C. at subatmospheric pressure of from about 0.1 to about 50 Torr;
    depositing a cavity fill metal at a temperature up to about 300° C. and at subatmospheric pressure of from about 0.1 to about 50 Torr in overlying relation with at least a portion of said cavity liner; and
    then applying pressure up to about 30 MPa, to said cavity fill metal at a temperature of from about 20° C. to about 300° C. to cause further filling of said cavity with said cavity fill metal.

2. The process according to claim 1, wherein at least one of said cavity liner and said fill metal is comprised of at least one of the following materials: (1) Al—Ti(0.1%)—Cu (0.5%); (2) Al—Cu (0.5%); (3) Al—Cu (1%); (4) Al—Si (1%)—Cu (0.5%); (5) aluminum, (6) copper (Cu); (7) alloys of copper with one or more of magnesium (Mg), gold (Au) and silver (Ag); and (8) Al—Sc—Cu.

3. The process according to claim 1, wherein said cavity extends at least partially into a dielectric material having a dielectric constant less than about 2.6.

4. The process according to claim 3, wherein said dielectric material comprises at least one of the following materials: polytetrafluoroethylene compounds, parylene, aerogels, xerogels, and polymeric spin-on-glass compounds.

5. A process for fabricating a semiconductor device having a polymeric dielectric and having a cavity disposed in or on the semiconductor substrate of said device which is filled with a cavity fill metal, comprising the steps of:
    providing a semiconductor substrate having a metal layer thereon and a layer of dielectric material over said metal layer;
    forming a cavity in said layer of dielectric material extending to said metal layer;
    depositing a cavity liner in said cavity at a temperature sufficiently low to avoid material alteration of the properties of the polymeric dielectric and at subatmospheric pressure of from about 0.1 to about 50 Torr;
    depositing a cavity fill metal at a temperature sufficiently low to avoid material alteration of the properties of the polymeric dielectric and at subatmospheric pressure of from about 0.1 to about 50 Torr in overlying relation with at least a portion of said cavity liner; and
    then applying pressure up to about 30 MPa but sufficiently high to said cavity fill metal and at a temperature sufficiently low to avoid material alteration of the properties of the polymeric dielectric to cause further filling of said cavity with said cavity fill metal.

6. The method of claim 5 wherein said temperature is less than 300° C.

7. The method of claim 5 wherein said pressure is from about 0.1 Torr to about 50 Torr.

8. The method of claim 6 wherein said pressure is from about 0.1 Torr to about 50 Torr.

9. The method of claim 5 wherein said polymeric dielectric has a dielectric constant less than about 2.6.

10. The method of claim 6 wherein said polymeric dielectric has a dielectric constant less than about 2.6.

11. The method of claim 7 wherein said polymeric dielectric has a dielectric constant less than about 2.6.

12. The method of claim 8 wherein said polymeric dielectric has a dielectric constant less than about 2.6.

* * * * *